US008039384B2

(12) United States Patent
Pagaila et al.

(10) Patent No.: US 8,039,384 B2
(45) Date of Patent: Oct. 18, 2011

(54) SEMICONDUCTOR DEVICE AND METHOD OF FORMING VERTICALLY OFFSET BOND ON TRACE INTERCONNECTS ON DIFFERENT HEIGHT TRACES

(75) Inventors: Reza A. Pagaila, Singapore (SG); KiYoun Jang, Kyoungki-do (KR); HunTeak Lee, Kyoungki-do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/720,029

(22) Filed: Mar. 9, 2010

(65) Prior Publication Data

US 2011/0221058 A1 Sep. 15, 2011

(51) Int. Cl.
*H01L 21/44* (2006.01)
(52) U.S. Cl. ........ 438/612; 438/107; 438/110; 438/614; 257/E21.499; 257/E21.508; 257/E21.51
(58) Field of Classification Search .................. 257/E21.5
See application file for complete search history.

(56) References Cited

U.S. PATENT DOCUMENTS

| 7,453,156 | B2 | 11/2008 | Lee et al. |
| 2007/0205520 | A1* | 9/2007 | Chou et al. ..................... 257/780 |
| 2007/0290345 | A1* | 12/2007 | Clevenger et al. ............ 257/738 |
| 2009/0032932 | A1 | 2/2009 | Do et al. |
| 2010/0044861 | A1* | 2/2010 | Chiu et al. ..................... 257/738 |
| 2010/0236822 | A1* | 9/2010 | Furutani et al. ............... 174/260 |

* cited by examiner

Primary Examiner — Cheung Lee
(74) Attorney, Agent, or Firm — Roberts D. Atkins; Patent Law Group

(57) ABSTRACT

A semiconductor device has a vertically offset BOT interconnect structure. The vertical offset is achieved by forming different height first and second conductive layer above a substrate. A first patterned photoresist layer is formed over the substrate. A first conductive layer is formed in the first patterned photoresist layer. The first patterned photoresist layer is removed. A second patterned photoresist layer is formed over the substrate. A second conductive layer is formed in the second patterned photoresist layer. The height of the second conductive layer, for example 25 micrometers, is greater than the height of the first conductive layer which is 5 micrometers. The first and second conductive layers are interposed between each other close together to minimize pitch and increase I/O count while maintaining sufficient spacing to avoid electrical shorting after bump formation. An interconnect structure is formed over the first and second conductive layers.

25 Claims, 6 Drawing Sheets

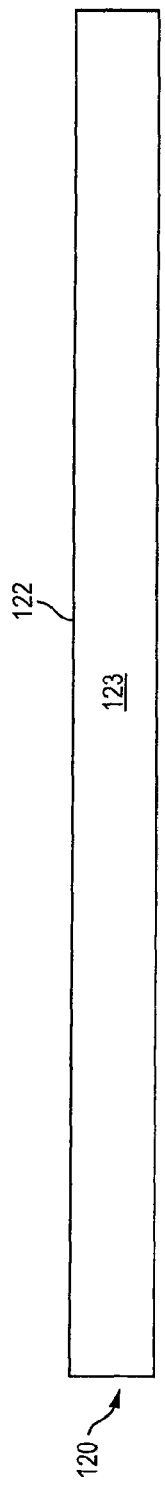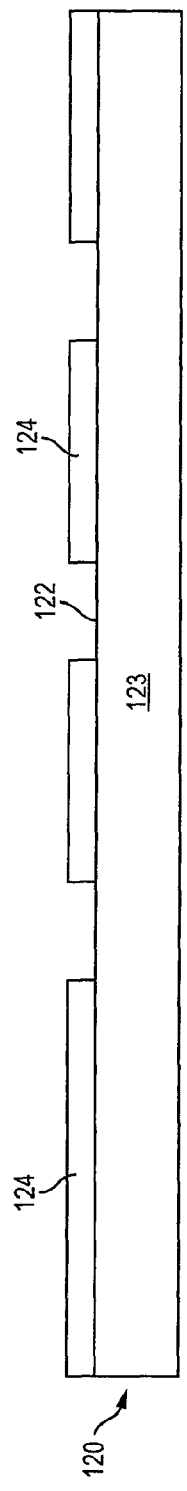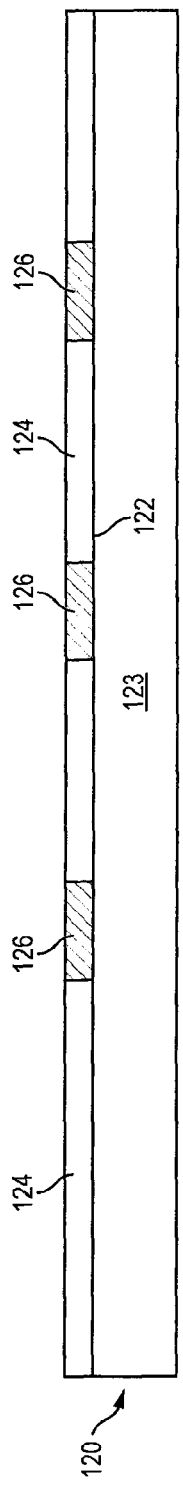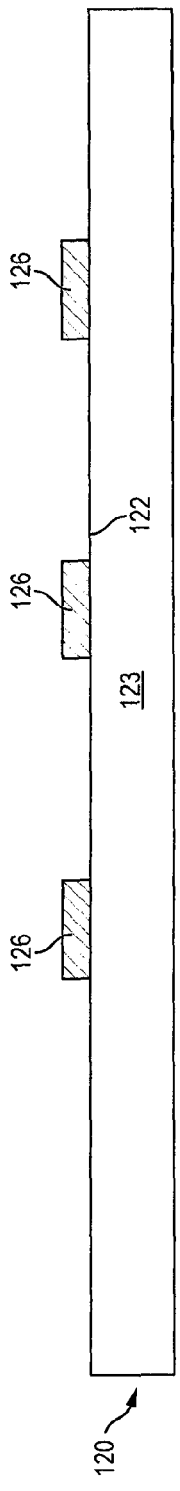

SEMICONDUCTOR DEVICE AND METHOD OF FORMING VERTICALLY OFFSET BOND ON TRACE INTERCONNECTS ON DIFFERENT HEIGHT TRACES

FIELD OF THE INVENTION

The present invention relates in general to semiconductor devices and, more particularly, to a semiconductor device and method of forming vertically offset bond on trace (BOT) interconnects on different height traces.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Many semiconductor devices require a fine pitch between the interconnect structures, e.g., between bond wire bumps, for a higher interconnect density and input/output (I/O) terminal count. To increase the I/O terminal count, the bond wire bumps can be laterally offset, staggered, or zig-zag pattern extending from the signal traces. The lateral offset allows the bond wire bumps to be positioned closer together, i.e., small pitch, without electrically shorting adjacent terminals. However, the lateral offset also requires longer bond fingers in order to form the bond wire bumps, which consumes die area. In addition, the BOT must have a sufficiently wide trace pitch to prevent shorting between bumps. The space requirements limit use of smaller substrates and add materials cost.

SUMMARY OF THE INVENTION

A need exists to decrease bond wire bump pitch without increasing trace width or length of the bond fingers. Accordingly, in one embodiment, the present invention is a method of making a semiconductor device comprising the steps of providing a substrate, forming a first patterned photoresist layer over the substrate, forming a first conductive layer having a height in the first patterned photoresist layer, removing the first patterned photoresist layer, forming a second patterned photoresist layer over the substrate, and forming a second conductive layer having a height in the second patterned photoresist layer. The height of the second conductive layer is greater than the height of the first conductive layer. Each second conductive layer is positioned adjacent to the first conductive layer and each first conductive layer is positioned adjacent to the second conductive layer. The method further includes the steps of removing the second patterned photoresist layer, and forming bumps over the first and second conductive layers.

In another embodiment, the present invention is a method of making a semiconductor device comprising the steps of providing a substrate, forming a first conductive layer having a height over the substrate, forming a second conductive layer having a height over the substrate, and forming an interconnect structure over the first and second conductive layers. The height of the second conductive layer is greater than the height of the first conductive layer. The first and second conductive layers are interposed with respect to each other.

In another embodiment, the present invention is a method of making a semiconductor device comprising the steps of providing a substrate, and forming a BOT interconnect structure over the substrate. The BOT interconnect structure includes forming a first conductive layer over the substrate, forming a second conductive layer over the substrate, and forming an interconnect structure over the first and second conductive layers. The second conductive layer has a height greater than a height of the first conductive layer. The first and second conductive layers are interposed with respect to each other.

In another embodiment, the present invention is a semiconductor device comprising a substrate and first conductive layer formed over the substrate. A second conductive layer is formed over the substrate. The second conductive layer has a height greater than a height of the first conductive layer. The first and second conductive layers are interposed with respect to each other. An interconnect structure is formed over the first and second conductive layers.

BRIEF DESCRIPTION OF THE DRAWINGS

FIGS. 3a-3j illustrate a process of forming vertically offset BOT interconnect sites on different height traces.

DETAILED DESCRIPTION OF THE DRAWINGS

Figure 1:
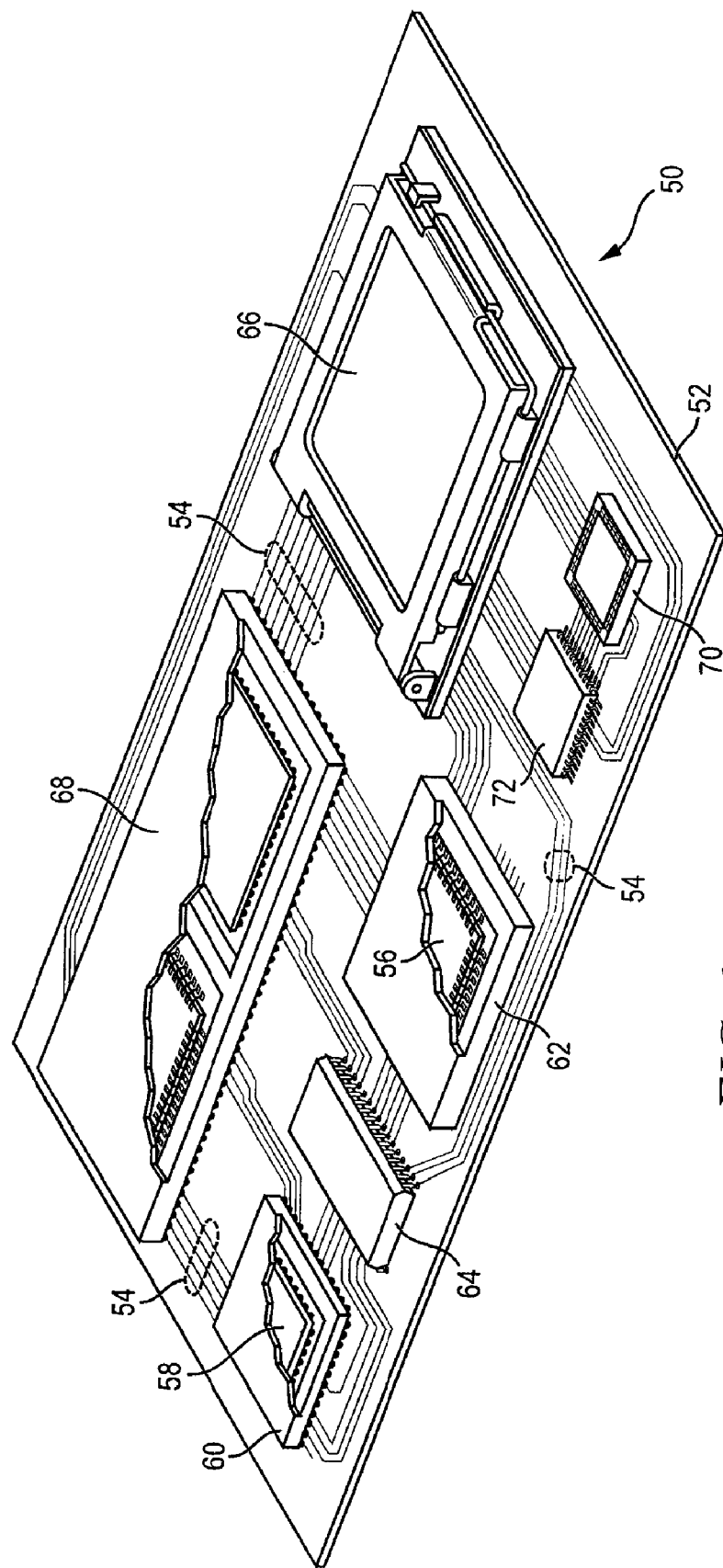
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
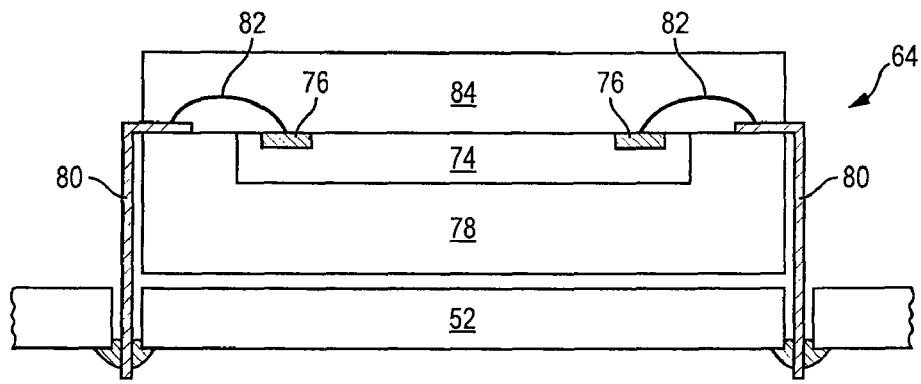
FIGS. 2a-2c illustrate further detail of the representative semiconductor packages mounted to the PCB.
Figure 2B:
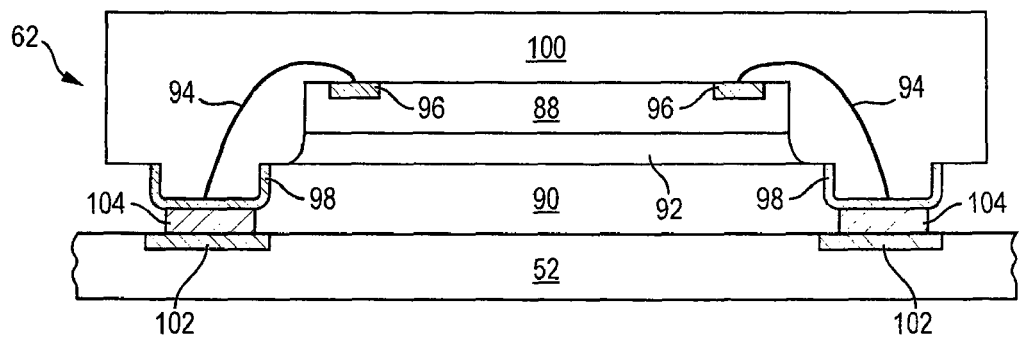
Figure 2C:
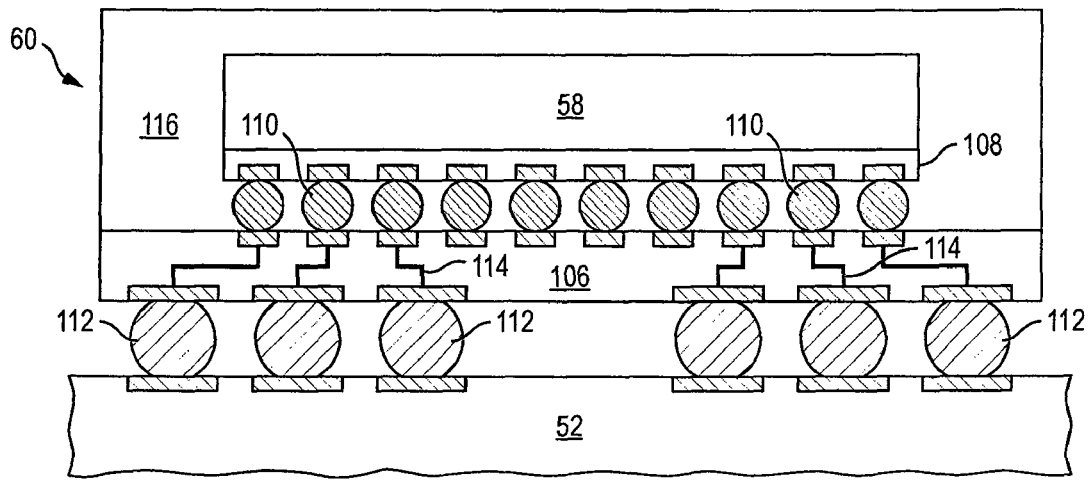

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3E:
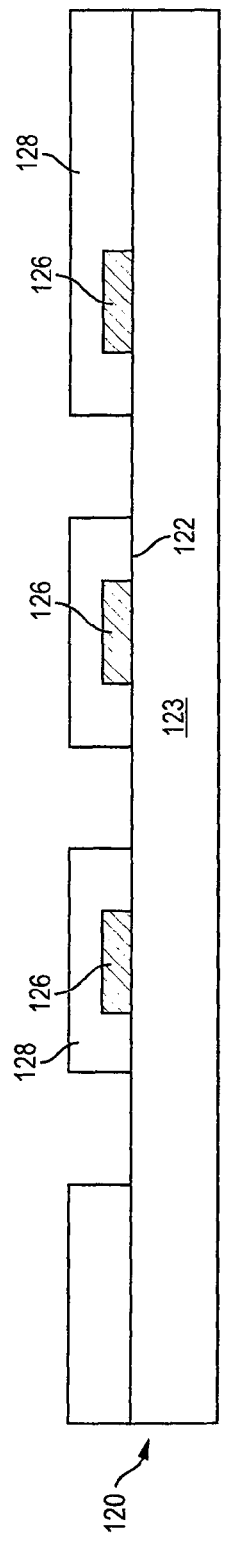

FIGS. 3a-3j illustrate a process of forming vertically offset BOT interconnect sites on different height traces. FIG. 3a shows a substrate 120 with a base substrate material, such as laminate BT substrate, dummy silicon wafer, germanium, gallium arsenide, indium phosphide, or silicon carbide, for structural support. Alternatively, semiconductor substrate 120 may have an active surface 122 formed over bulk material 123 containing analog or digital circuits implemented as active devices, passive devices, conductive layers, and dielectric layers electrically interconnected according to the electrical design and function of the die. For example, the circuit may include one or more transistors, diodes, and other circuit elements formed within active surface 122 to implement analog circuits or digital circuits, such as digital signal processor (DSP), ASIC, memory, or other signal processing circuit. The semiconductor substrate may also contain IPDS, such as inductors, capacitors, and resistors, for RF signal processing.

In FIG. 3b, high-resolution dry film photoresist layer 124 is formed over active surface 122 to a thickness of 5 micrometers (μm). A portion of dry film layers 124 is removed to pattern active surface 122.

In FIG. 3c, an electrically conductive layer 126 is formed in the removed portions of dry film layer 124 over the exposed active surface 122 using PVD, CVD, electrolytic plating, electroless plating process, or other suitable metal deposition process. Conductive layer 126 can be one or more layers of Al, Cu, Sn, Ni, Au, Ag, or other suitable electrically conductive material.

In FIG. 3d, the remaining dry film layer 124 is removed, leaving conductive layer 126 extending above active surface 122. In one embodiment, conductive layer 126 has a height of 5 μm above substrate 120.

In FIG. 3e, high-resolution dry film photoresist layer 128 is formed over active surface 122 and conductive layer 126 to a thickness of 25 μm. Accordingly, the thickness of dry film layer 128 is greater than the thickness of dry film layer 124. A portion of dry film layers 128 is removed to pattern active surface 122.

Figure 3F:
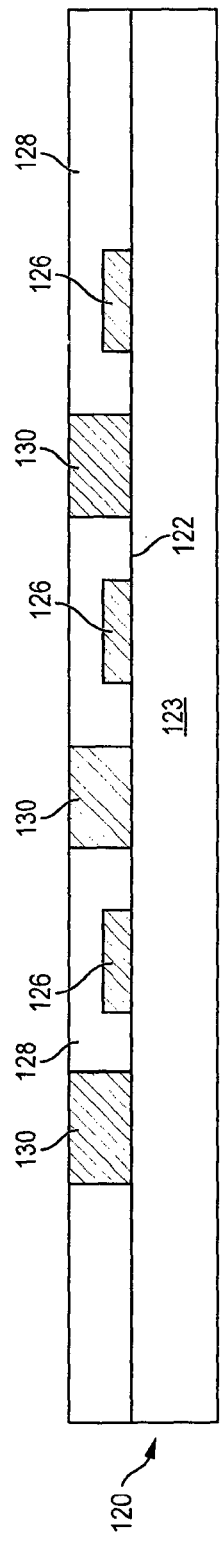

In FIG. 3f, an electrically conductive layer 130 is formed in the removed portions of dry film layer 128 over the exposed active surface 122 using PVD, CVD, electrolytic plating, electroless plating process, or other suitable metal deposition process. Conductive layer 130 can be one or more layers of Al, Cu, Sn, Ni, Au, Ag, or other suitable electrically conductive material.

Figure 3G:
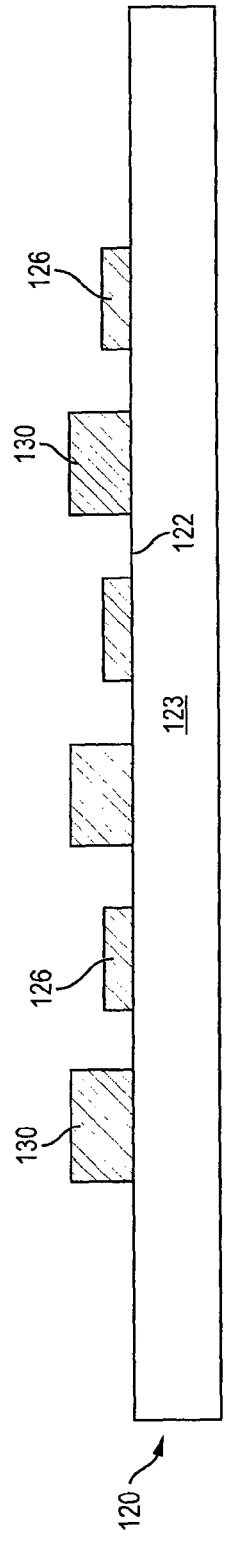

In FIG. 3g, the remaining dry film layer 128 is removed, leaving conductive layer 130 extending above active surface 122. In one embodiment, conductive layer 130 has a height of 25 μm above substrate 120, or about 20 μm higher than conductive layer 126. Conductive layer 130 is formed in an alternating pattern or interposed between conductive layer 126. That is, each conductive layer 130 is positioned adjacent to conductive layer 126, and each conductive layer 126 is positioned adjacent to conductive layer 130. Conductive layers 126 and 130 are placed close together to minimize pitch and increase I/O count while maintaining sufficient spacing to avoid electrical shorting after bump formation. In one embodiment, the pitch between conductive layer 126 and conductive layer 130 is less than 60 μm.

Figure 3H:
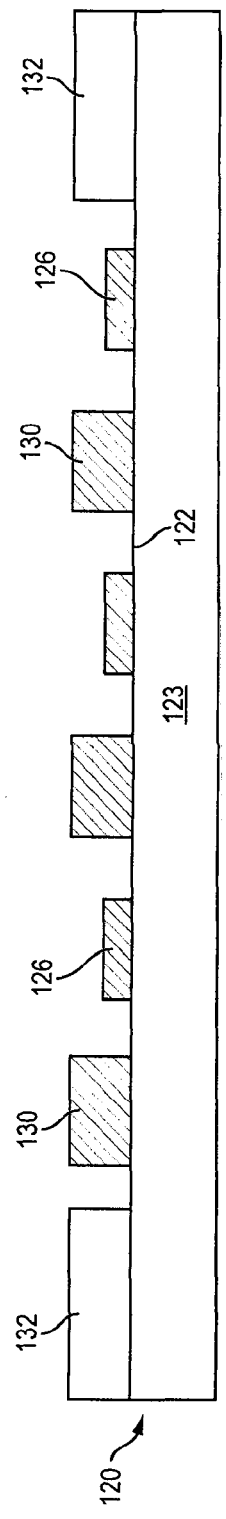

In FIG. 3h, a solder mask 132 is formed around conductive layers 126 and 130 in preparation for bump formation.

Figure 3I:
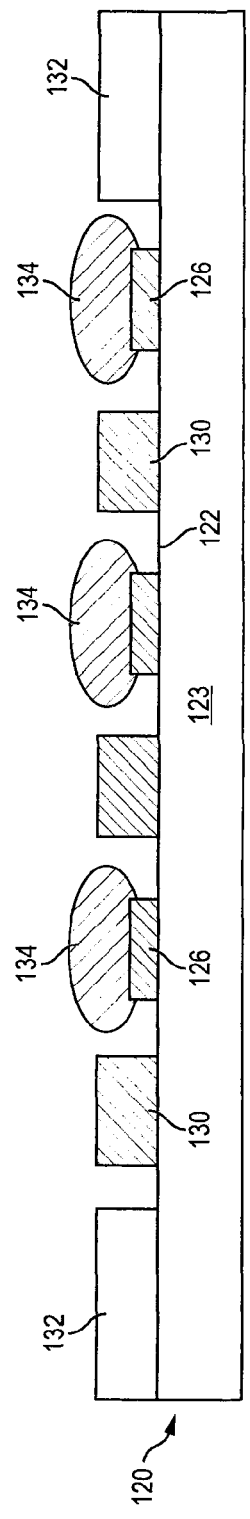

In FIG. 3i, an electrically conductive bump material is deposited over conductive layer 126 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 126 using a suitable attachment or bonding process. In one embodiment, the bump material is reflowed by heating the material above its melting point to form spherical balls or bumps 134. In some applications, bumps 134 are reflowed a second time to improve electrical contact to conductive layer 126. The bumps can also be compression bonded to conductive layer 126. Bumps 134 represent one type of interconnect structure that can be formed over conductive layer 126. In this embodiment, bumps 134 are bond wire bumps. The interconnect structure can also use bond wires, stud bump, micro bump, or other electrical interconnect.

Figure 3J:
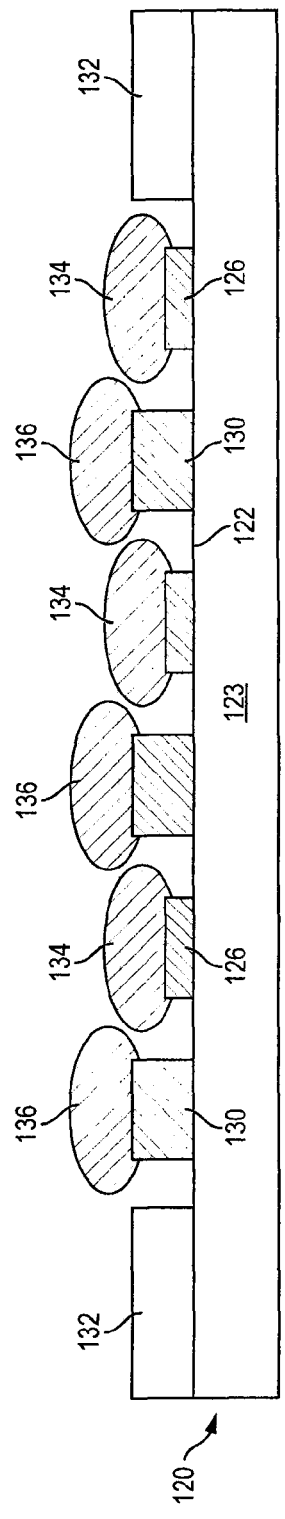

In FIG. 3j, an electrically conductive bump material is deposited over conductive layer 130 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 130 using a suitable attachment or bonding process. In one embodiment, the bump material is reflowed by heating the material above its melting point to form spherical balls or bumps 136. In some applications, bumps 136 are reflowed a second time to improve electrical contact to conductive layer 130. The bumps can also be compression bonded to conductive layer 130. Bumps 136 represent one type of interconnect structure that can be formed over conductive layer 130. In this embodiment, bumps 136 are bond wire bumps. The interconnect structure can also use bond wires, stud bump, micro bump, or other electrical interconnect.

Figure 4A:
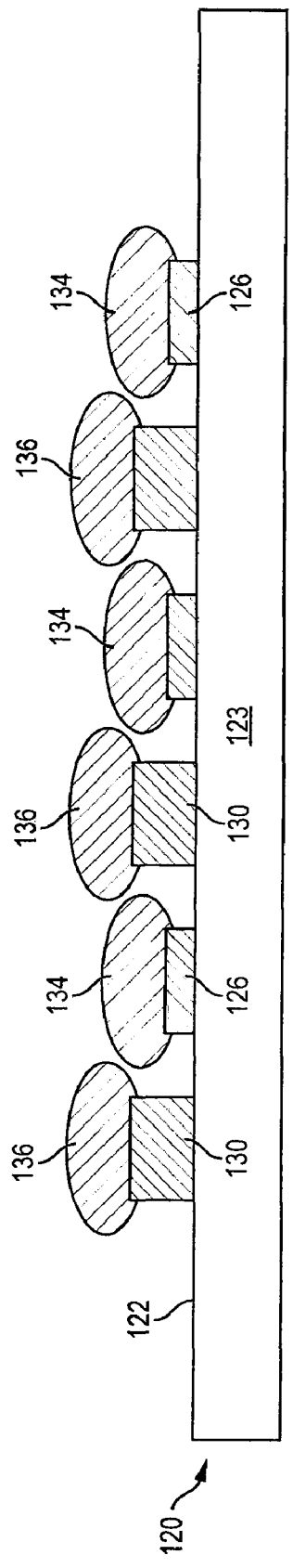
FIGS. 4a-4b illustrate top and side views of the vertically offset BOT interconnect sites on different height traces.

FIG. 4a shows the vertical offset between bond wire bumps 134 and 136 formed on bond fingers 126 and 130. Solder mask 132 is removed after formation of bond wire bumps 134 and 136. Conductive layers 126 and 130 are bond fingers formed on substrate 120. Bond finger 126 and 130 are part of or electrically connected to traces routed on active surface 122. The bond fingers 126 and 130 provide interconnectivity between active and passive circuits formed on active surface 122 and the external electronic components.

Figure 4B:
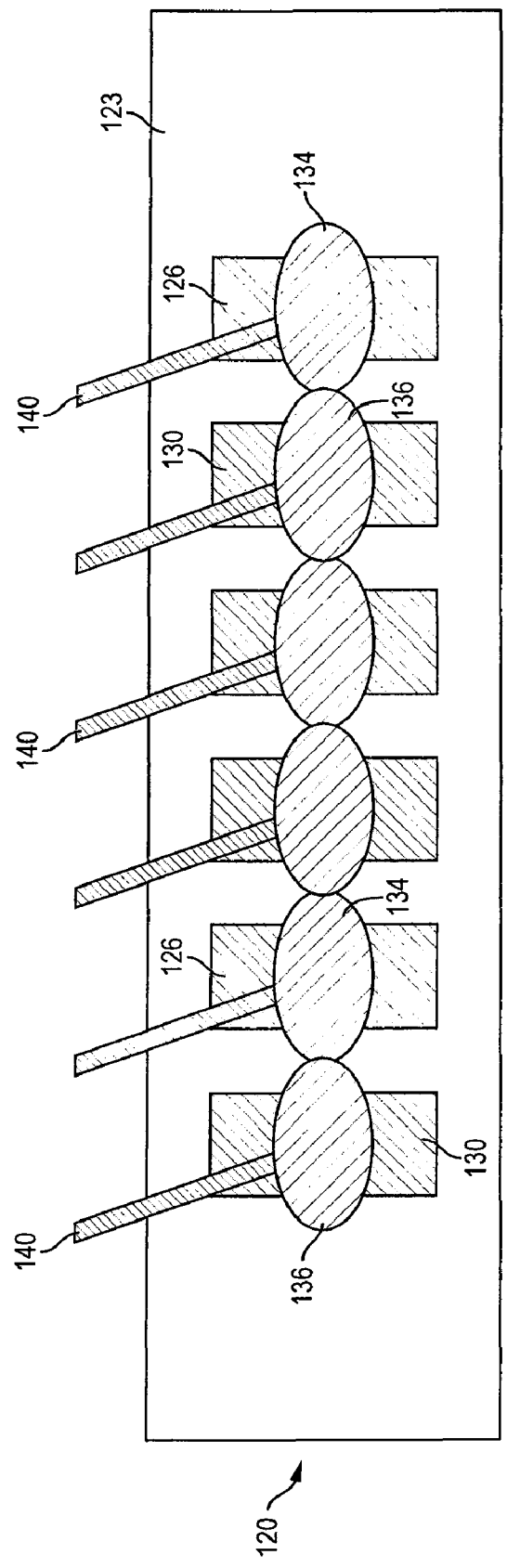

FIG. 4b shows bond wires 140 are formed on bumps 134 and 136, i.e., BOT interconnection, and routed to external electronic components. Bond wires 140 are arranged in straight-configuration to avoiding zig-zag configuration which permits use of a smaller substrate. With 20 μm (0.8 mil) bond wires, the height of bond wire bumps 134 and 136 is about 10 μm. The vertical offset between bond fingers 126 and 130 allows bond wire bumps to be placed closer together, e.g., smaller pitch. The outer dimensions of bond wire bumps 134 and 136 can overlap in the plan view of FIG. 4b, but do not electrically short due to the physical separation between the bumps provided by the vertical offset, as seen in FIG. 4a. The interconnect density of the bond wires increases with the smaller pitch of the bond wire bumps, without increasing the length of the bond fingers. In addition, the smaller pitch provides for smaller bond wires which reduces manufacturing cost.

Bond fingers 126 and 130 are formed using dual-time trace patterning, i.e., the conductive layers are formed with different trace patterning at different times, as described in FIGS. 3b-3h. The dual-time trace patterning provides a fine pitch interconnection and enables use of smaller wafer substrate size due to straight-wire bond configuration. The substrate, bond wire, and molding compound cost are reduced.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a first patterned photoresist layer over the substrate;
   forming first conductive layers having a first height in the first patterned photoresist layer;
   removing the first patterned photoresist layer;
   forming a second patterned photoresist layer over the substrate;
   forming second conductive layers having a second height in the second patterned photoresist layer, the second height greater than the first height, each second conductive layer being positioned adjacent to a first conductive layer and each first conductive layer being positioned adjacent to a second conductive layer, and wherein a pitch between the first conductive layer and the second conductive layer is less than sixty (60) micrometers;
   removing the second patterned photoresist layer; and
   forming first bumps and second bumps over the first and second conductive layers, respectively, wherein second bumps overlap neighboring first bumps, wherein a height and a width of the first bumps are substantially the same as a height and a width of the second bumps, and wherein uppermost surfaces of the second bumps are vertically offset from uppermost surfaces of the first bumps.

2. The method of claim 1, further including forming bond wires on the first and second bumps.

3. The method of claim 1, further including:
   forming the first conductive layer to a height of 5 micrometers; and
   forming the second conductive layer to a height of 25 micrometers.

4. The method of claim 1, further including forming a solder mask around the first and second conductive layers prior to forming the first and second bumps.

5. A method of making a semiconductor device, comprising:
- providing a substrate;
- forming first conductive layers having a first height over the substrate;
- forming second conductive layers having a second height over the substrate, the second height being greater than the first height, the first and second conductive layers being interposed with respect to each other, and wherein a pitch between the first and second conductive layers is less than 60 micrometers; and
- forming first and second interconnect structures over the first and second conductive layers, respectively, wherein upper surfaces of the second interconnect structures are vertically offset from upper surfaces of the first interconnect structures.

6. The method of claim 5, wherein forming the first and second interconnect structures includes forming conductive posts or bond wires over the first and second conductive layers.

7. The method of claim 5, wherein forming the first conductive layers includes:
- forming a first patterned photoresist layer over the substrate;
- forming the first conductive layers in the first patterned photoresist layer; and
- removing the first patterned photoresist layer.

8. The method of claim 5, wherein forming the second conductive layers includes:
- forming a second patterned photoresist layer over the substrate;
- forming the second conductive layers in the second patterned photoresist layer; and
- removing the second patterned photoresist layer.

9. The method of claim 5, further including forming bond wires on the first and second interconnect structures.

10. The method of claim 5, further including:
- forming the first conductive layers to a height of 5 micrometers; and
- forming the second conductive layers to a height of 25 micrometers.

11. The method of claim 5, further including forming a solder mask around the first and second conductive layers prior to forming the first and second interconnect structures.

12. The method of claim 5, wherein forming first and second interconnect structures comprises forming first and second conductive bumps, wherein the second conductive bumps overlap the first conductive bumps.

13. A method of making a semiconductor device, comprising:
- providing a substrate; and
- forming bumps on trace (BOT) interconnect structure over the substrate, the BOT interconnect structure including,
  - (a) first conductive layers disposed over the substrate,
  - (b) second conductive layers disposed over the substrate, the second conductive layers having a height greater than a height of the first conductive layers, the first and second conductive layers being interposed with respect to each other, and wherein a pitch between the first and second conductive layers is less than 60 micrometers, and
  - (c) an interconnect structure disposed over the first and second conductive layers.

14. The method of claim 13, wherein the interconnect structure includes:
- first and second bumps disposed over the first and second conductive layers, respectively; and
- bond wires disposed on the first and second bumps.

15. The method of claim 14, wherein upper surfaces of the second bumps are vertically offset from upper surfaces of the first bumps, and wherein a height and a width of the first bumps are substantially the same as a height and a width of the second bumps.

16. The method of claim 13, wherein forming the first conductive layers includes:
- forming a first patterned photoresist layer over the substrate;
- forming the first conductive layers in the first patterned photoresist layer; and
- removing the first patterned photoresist layer.

17. The method of claim 13, wherein forming the second conductive layers includes:
- forming a second patterned photoresist layer over the substrate;
- forming the second conductive layers in the second patterned photoresist layer; and
- removing the second patterned photoresist layer.

18. The method of claim 13, further including:
- forming the first conductive layers to a height of 5 micrometers; and
- forming the second conductive layers to a height of 25 micrometers.

19. The method of claim 13, further including forming a solder mask around the first and second conductive layers prior to forming the interconnect structure.

20. A semiconductor device, comprising:
- a substrate;
- a first conductive layer formed over the substrate;
- a second conductive layer formed over the substrate, the second conductive layer having a height greater than a height of the first conductive layer, the first and second conductive layers being interposed with respect to each other; and
- first and second interconnect structures formed over the first and second conductive layers, respectively, wherein upper surfaces of the second interconnect structures are vertically offset from upper surfaces of the first interconnect structures.

21. The semiconductor device of claim 20, wherein the first and second interconnect structures include conductive posts or bond wires formed over the first and second conductive layers.

22. The semiconductor device of claim 21, wherein the first and second interconnect structures comprise:
- first and second bumps formed over the first and second conductive layers, respectively, wherein the second bumps overlap the first bumps; and
- bond wires formed on the first and second bumps.

23. The semiconductor device of claim 20, wherein the first conductive layer has a height of 5 micrometers and the second conductive layer has a height of 25 micrometers.

24. The semiconductor device of claim 20, further including a solder mask formed around the first and second conductive layers.

25. The semiconductor device of claim 20, wherein a pitch between the first and the second conductive layers is less than 60 micrometers.

* * * * *